(12) United States Patent
Koren et al.

(10) Patent No.: US 6,770,146 B2
(45) Date of Patent: Aug. 3, 2004

(54) METHOD AND SYSTEM FOR ROTATING A SEMICONDUCTOR WAFER IN PROCESSING CHAMBERS

(75) Inventors: Zion Koren, Sunnyvale, CA (US); Yorkman Ma, San Jose, CA (US); Rudy Santo Tomas Cardema, San Jose, CA (US); James Tsuneo Taoka, San Jose, CA (US); Lois Wride, Valley View (AU); Craig McFarland, Calgary (CA); Shawn Gibson, Calgary (CA)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/776,241

(22) Filed: Feb. 2, 2001

(65) Prior Publication Data

US 2002/0104619 A1 Aug. 8, 2002

(51) Int. Cl.⁷ .......................... H01L 21/00; C23C 16/00
(52) U.S. Cl. .................. 118/730; 118/725; 118/728; 118/500; 156/345.51; 156/345.52; 156/345.55; 310/90.5; 310/237
(58) Field of Search ................................ 118/730, 725, 118/500, 50.1; 156/345.51, 345.52, 345.55; 310/90.5, 237

(56) References Cited

U.S. PATENT DOCUMENTS

| | | | |
|---|---|---|---|
| 3,771,462 A | * | 11/1973 | Barthalon et al. .......... 104/290 |
| 4,793,911 A | | 12/1988 | Kemmerer et al. |
| 4,798,926 A | | 1/1989 | Sakai |
| 4,869,802 A | | 9/1989 | Wirz et al. |
| 5,086,729 A | | 2/1992 | Katagiri |
| 5,113,102 A | | 5/1992 | Gilmore |
| 5,147,828 A | | 9/1992 | Ebbing et al. |
| 5,155,336 A | | 10/1992 | Gronet et al. |
| 5,216,308 A | | 6/1993 | Meeks |
| 5,216,590 A | | 6/1993 | Ota |
| 5,224,581 A | | 7/1993 | Ebbing et al. |
| 5,227,948 A | | 7/1993 | Boon et al. |
| 5,376,862 A | | 12/1994 | Stevens |
| 5,444,217 A | | 8/1995 | Moore et al. |
| 5,468,299 A | | 11/1995 | Tsai |
| 5,630,881 A | | 5/1997 | Ogure et al. |
| 5,631,617 A | * | 5/1997 | Morishita .................... 335/216 |
| 5,732,636 A | * | 3/1998 | Wang et al. ................. 104/284 |
| 5,780,943 A | | 7/1998 | Ono |
| 5,795,448 A | | 8/1998 | Hurwitt et al. |
| 5,818,137 A | * | 10/1998 | Nichols et al. ............. 310/90.5 |

(List continued on next page.)

FOREIGN PATENT DOCUMENTS

| | | | | | |
|---|---|---|---|---|---|
| JP | 63108657 A | * | 5/1988 | .......... | H01J/37/317 |
| JP | 05028953 A | * | 2/1993 | .......... | H01J/37/317 |
| JP | 07039015 A | * | 2/1995 | .......... | B60L/13/04 |
| JP | 2001069746 A | * | 3/2001 | .......... | H02K/41/03 |
| JP | 2002093724 A | * | 3/2002 | ......... | H01L/21/205 |
| WO | WO 9852214 | | 11/1998 | | |

Primary Examiner—Gregory Mills
Assistant Examiner—Ram N Kacker
(74) Attorney, Agent, or Firm—Dority & Manning, P.A.

(57) ABSTRACT

The present invention is generally directed to a system and process for rotating semiconductor wafers in thermal processing chambers, such as rapid thermal processing chambers and chemical vapor deposition chambers. In accordance with the present invention, a semiconductor wafer is supported on a substrate holder which, in turn, is supported on a rotor. During processing, the rotor is magnetically levitated and magnetically rotated by suspension actuators and rotation actuators positioned outside of the chamber.

38 Claims, 7 Drawing Sheets

U.S. PATENT DOCUMENTS

| | | |
|---|---|---|
| 5,840,125 A | 11/1998 | Gronet et al. |
| 5,871,588 A | 2/1999 | Moslehi et al. |
| 5,982,986 A | 11/1999 | Davenport |
| 5,989,342 A | 11/1999 | Ikeda et al. |
| 6,005,281 A | 12/1999 | Conboy et al. |
| 6,022,413 A * | 2/2000 | Shinozaki et al. ........... 118/715 |
| 6,154,353 A * | 11/2000 | Bowers et al. .............. 361/144 |
| 6,157,106 A * | 12/2000 | Tietz et al. ................. 310/90.5 |
| 6,320,290 B1 * | 11/2001 | Kanebako et al. ......... 310/90.5 |
| 6,464,825 B1 * | 10/2002 | Shinozaki .............. 156/345.55 |

* cited by examiner

US 6,770,146 B2

METHOD AND SYSTEM FOR ROTATING A SEMICONDUCTOR WAFER IN PROCESSING CHAMBERS

BACKGROUND OF THE INVENTION

Integrated circuit chips are typically formed on semiconductor wafers. Various layers of different materials are built on the wafers in various different types of chambers. Such chambers can include rapid thermal processing chambers and chemical vapor deposition chambers. In a chemical vapor deposition chamber, a gas or vapor is fed into the chamber which reacts with the surface of the wafer.

A rapid thermal processing chamber, which can be used as a chemical vapor deposition chamber, refers to a device that rapidly heats objects, such as semiconductor wafers. Such devices typically include a substrate holder for holding a semiconductor wafer and an energy source for heating the wafer. During heat treatment, the semiconductor wafers are heated under controlled conditions according to a pre-set temperature regime. For monitoring the temperature of the semiconductor wafer during heat treatment, thermal processing chambers also typically include radiation sensing devices, such as pyrometers, that sense the radiation being emitted by the semiconductor wafer at a selected wavelength. By sensing the thermal radiation being emitted by the wafer, the temperature of the wafer can be calculated with reasonable accuracy.

Many semiconductor heating processes require a wafer to be heated to high temperatures so that various chemical and physical transformations can take place as devices are fabricated on the wafer. During rapid thermal processing, which is one type of processing, semiconductor wafers are typically heated by an array of lights to temperatures, for instance, from about 400° C. to about 1,200° C., for times which are typically less than a few minutes. During these processes, one main goal is to heat the wafers as uniformly as possible.

In order to heat wafers as uniformly as possible, the wafers are typically rotated within the thermal processing chamber. Rotating the wafer promotes greater temperature uniformity over the surface of the wafer and promotes enhanced contact between the wafer and any gases introduced into the chamber.

In the past, various mechanical systems have been used in order to rotate wafers in thermal processing chambers. Unfortunately, however, the mechanical systems have a tendency to generate small particles caused by the mechanical parts contacting each other. These particles can enter the chamber and contaminate the process being carried out. Even the slightest amount of contamination within the chamber can drastically affect the properties of the wafer or of layers being formed on the wafer.

As such, a need currently exists for an improved process and system for rotating wafers in thermal processing chambers, such as rapid thermal processing chambers and chemical vapor deposition chambers. In particular, a need exists for a system and process for rotating wafers in thermal processing chambers that efficiently rotate the wafers without the risk of contaminating the processing chamber.

SUMMARY OF THE INVENTION

The present invention is generally directed to a method and system for processing semiconductor wafers in thermal processing chambers. More particularly, the present invention is directed to magnetically levitating and magnetically rotating semiconductor wafers during processing.

For example, in one embodiment, the system of the present invention includes a thermal processing chamber adapted to contain semiconductor wafers. A heating device, such as a plurality of energy sources, are positioned outside the chamber for heating the semiconductor wafers contained within the chamber. A rotatable substrate holder is positioned within the thermal processing chamber and is configured to support a wafer being processed.

According to the present invention, the system further includes a rotor supporting the substrate holder. The rotor can have a circular shape and can be made partially or completely of a material capable of being influenced by a magnetic force. At least one suspension actuator is positioned outside of the chamber and above, below or at an angle to the rotor for levitating the rotor. In order to rotate the rotor, the system further includes a plurality such as at least three rotation actuators also positioned on top, on the side or below the rotor outside of the chamber. The suspension actuator and the rotation actuator each are capable of generating a magnetic field for levitating and rotating the rotor respectively.

In one embodiment, the rotation actuator includes a C-shaped magnetic element having a pair of opposing poles that define first and second rotation surfaces. The C-shaped magnetic element is placed in operative association with a magnetic coil that generates a magnetic field when an electric current is fed through the coil. The rotor can be positioned in between the first and second rotation surfaces.

The rotor can have a smooth surface or can include a plurality of spaced apart radial teeth. The teeth can be positioned in between the first and second rotation surfaces. In this embodiment, the rotation actuator can create a pulsing or variable magnetic field that acts upon the radial teeth to rotate the rotor.

Besides using a rotation actuator which produces a variable magnetic field through the use of a magnetic element and a magnetic coil, in an alternative embodiment of the present invention, the rotation actuator can be a rotating disk that contains a plurality of permanent magnets. The disk can be positioned so that the edge of the disk is located adjacent to the rotor as the disk is rotated. The disk can be rotated using, for instance, a motor. Permanent magnets can be installed on the periphery of the disk with the magnetic pole ends in the radial direction. In this manner, as the disk is rotated, the permanent magnets induce a field in the rotor. The induced field causes an attractive force to be set up between the rotor and each rotating permanent magnet. As the magnet turns and moves away from the induced field of the rotor, the attractive force results in a torque which causes the rotor to rotate. One or more of these disks containing the permanent magnets can be placed adjacent to the rotor as desired.

As mentioned above, the system of the present invention includes at least one rotation actuator. In one embodiment, the system can include a plurality of rotation actuators, such as from about three rotation actuators to about twelve or more rotation actuators. The rotation actuators can be positioned around the rotor at any desired location.

The suspension actuator used in the present invention, in one embodiment, can include a U-shaped magnetic element surrounded by a coil. Similar to the rotation actuator, the magnetic element can generate a magnetic field when an electric current is fed through the coil.

The U-shaped magnetic element of the suspension actuator can include a first suspension surface and a second suspension surface that face the rotor. The rotor, in turn, can include first and second annular raised portions positioned below the first and second suspension surfaces. When the suspension actuator creates a magnetic field, the rotor can be levitated through the attraction of the first and second annular raised portions with the first and second suspension surfaces. Through this configuration, not only is the rotor levitated, but is also maintained in radial alignment due to the presence of both of the annular raised portions and the reluctance centering relationship they form with the suspension actuator.

In one embodiment, the system can include position sensors located adjacent to the rotor. The position sensors can monitor the vertical position of the rotor in relation to a horizontal plane. In one embodiment, the system can include two vertical position sensors, one being the reference sensor. The position sensors can be placed in communication with a controller, such as a microprocessor. The controller can be configured to receive information from the position sensors regarding the position of the rotor and, based on the information received, to independently adjust each suspension actuator included in the system for levitating the rotor a determined distance and for maintaining the rotor parallel to the horizontal plane. Besides being controlled independently, the suspension actuators can also be controlled in coordination with each other. Coordinating control can be implemented in a multi-input-multi-output control scheme.

Besides vertical position sensors, the system can also include rotation sensors. For example, a first rotation sensor can be used to monitor the speed of the rotor, while another rotation sensor can be used for homing position. Examples of rotation sensors that may be used in the present invention include Hall Effect sensors or laser sensors.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
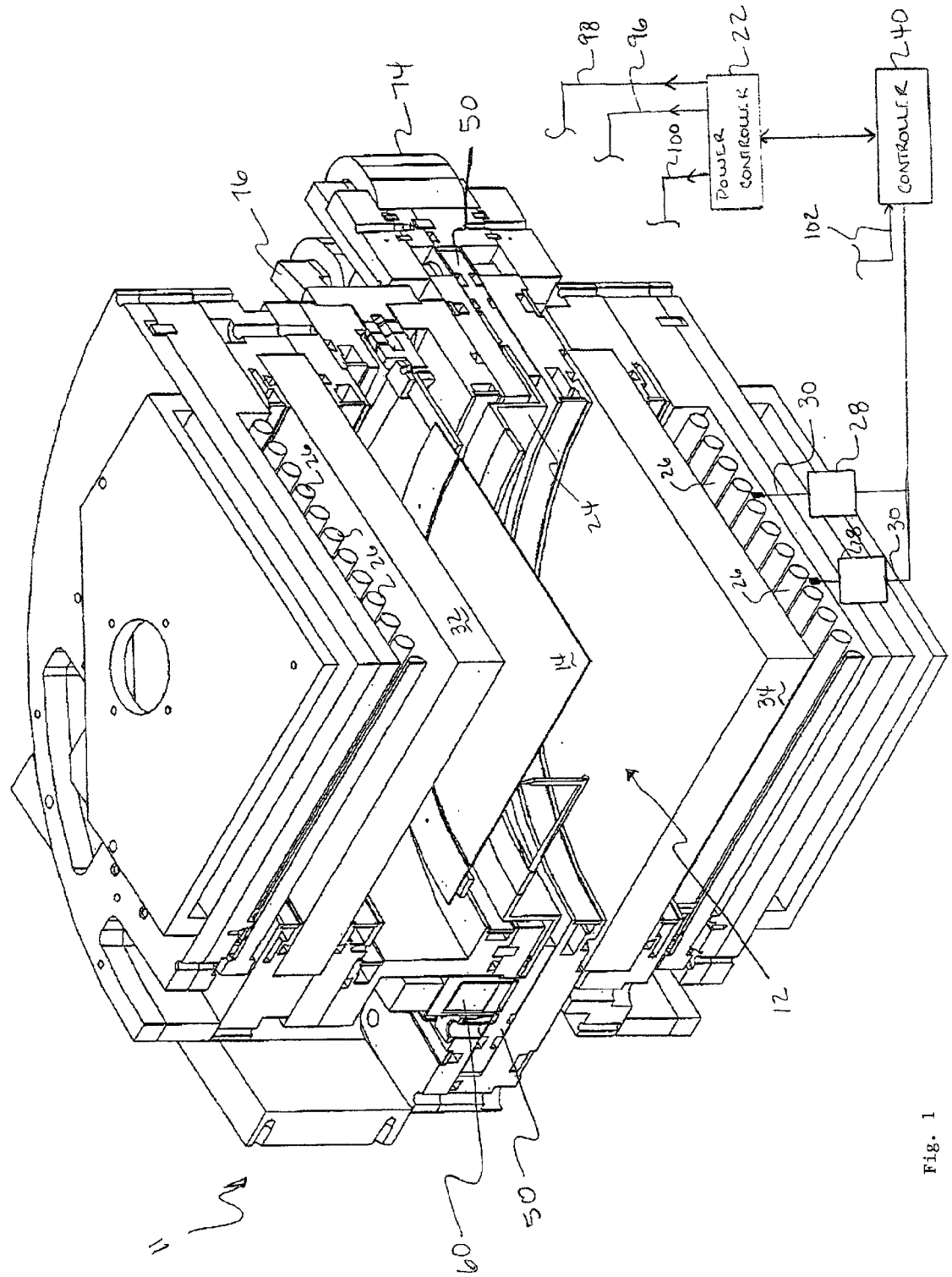
FIG. 1 is a sectional view of one embodiment of an apparatus for processing semiconductor wafers made in accordance with the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to an apparatus and method for processing wafers in a thermal processing chamber, such as a rapid thermal processing chamber and/or a chemical vapor deposition chamber. More particularly, the present invention is directed to a system and method for rotating wafers in thermal processing chambers.

During the processing of wafers in thermal processing systems, the wafers are typically rotated in order to ensure uniform temperature distribution and uniform contact with gases flowing through the chamber. In the past, various mechanical bearings have been used in order to rotate the wafers. Due to friction, these bearings can have a tendency to produce contaminants which enter the thermal processing chamber and can adversely interfere with processes occurring therein. As such, the present invention is directed to a system and process for rotating wafers in thermal processing chambers that does not produce the type of contamination associated with mechanical bearings. Specifically, the present invention is directed to magnetically levitating and magnetically rotating wafers in thermal processing chambers. Through the use of magnetic forces, a rotor supporting a semiconductor wafer can be rotated in accordance with the present invention without any mechanical parts contacting the rotor.

Besides eliminating the generation of particles caused by mechanical bearings, the system of the present invention has other various advantages. For instance, the rotation system of the present invention provides better performance by operating with lower vibrations and reduced sensitivity to corrosive chemicals and deposition from process gases. Because the rotor is rotated without contacting any other parts, the system of the present invention has a long useful life and requires little maintenance. Further, seals are not required or the use of lubricants. Because all of the active components are located outside of the thermal processing chamber, the rotation system of the present invention does not interfere with processes occurring in the chamber, which makes it simpler to control the atmosphere within the chamber, such as maintaining a vacuum within the chamber etc.

Referring to FIG. 1, an apparatus 11 made in accordance with one embodiment of the present invention for heat treating wafers, such as silicon wafers, is shown. The apparatus includes a thermal processing chamber 12 generally adapted to receive a wafer 14 for conducting various processes. The apparatus 11 is designed to heat wafer 14 at very rapid rates and under carefully controlled conditions.

The walls of thermal processing chamber 12 can be made from various materials including metals and ceramics. For instance, chamber 12, in one embodiment, can be made from stainless steel. When chamber 12, however, is made from a heat conductive material, preferably the chamber includes a cooling system. For instance, chamber 12 can include a cooling conduit (not shown) wrapped around the perimeter of the chamber or channels built into the apparatus for circulating a cooling fluid, such as water, which is used to cool the chamber during operation.

The apparatus 11 can also include a gas inlet and a gas outlet for introducing and circulating a gas into the chamber 12 if desired. For instance, a gas, such as an inert gas, can be introduced into thermal processing chamber 12 through a gas inlet for preventing and inhibiting any adverse chemical reactions from occurring within the chamber. The inert gas, for instance, can be nitrogen.

In an alternative embodiment, a gas can be introduced into thermal processing chamber 12 that contains a gaseous reactant. The gaseous reactant can be designed to react with wafer 14 for depositing a film or coating on the surface of the wafer. The reactant can be used for RTP processes, CVD processes, or wafer cleaning processes.

As shown, wafer 14 is positioned within thermal processing chamber 12 on a substrate holder 24. During processing, substrate holder 24 rotates wafer 14. The present invention is particularly directed to an improved system for rotating wafer 14 in the thermal processing chamber as will described in more detail below.

In order to heat wafer 14, the system of the present invention includes a heating energy source in communication with thermal processing chamber 12. In the embodiment illustrated in FIG. 1, the energy source comprises a plurality of lamps 26, such as tungsten-halogen lamps, positioned below and above wafer 14. If desired, lamps 26 can be surrounded by a reflector or a set of reflectors for carefully directing thermal energy being emitted by the lamps onto wafer 14 at particular locations. Besides being placed above and below wafer 14, lamps 26 may be placed only above the wafer, only below the wafer and/or at any particular location.

The particular type of lamps that can be used in thermal processing chambers made according to the present invention can vary depending upon the particular circumstances. In the embodiment illustrated in FIG. 1, the lamps 26 are elongated linear lamps that are oriented horizontally in a plane parallel to the wafer. In other embodiments, however, shorter vertically oriented lamps can also be used.

The use of lamps 26 as a heat source can provide various benefits. For instance, lamps have much higher heating and cooling rates than other heating devices, such as electrical elements or conventional furnaces. Lamps 26 create a rapid thermal processing system that provides instantaneous energy, typically requiring a very short and well controlled start up period. The flow of energy from lamps 26 can also be abruptly stopped at any time. Lamps 26 can be equipped with a gradual power controller 22 that can be used to increase or decrease the thermal energy being emitted by the lamps.

Besides using light energy sources as shown in the figures, however, in an alternative embodiment, the wafer can be heated using a susceptor. A susceptor is a heated element placed adjacent to the wafer. For most applications, the susceptor is heated through electrical resistance.

In order to monitor the temperature of wafer 14 during a thermal process taking place inside the chamber, one or more radiation sensing devices 28 are included in communication with the chamber. Radiation sensing devices 28, which can be, for instance, pyrometers, include an optical fiber or light pipe 30 which extends from each radiation sensing device 28 adjacent to the chamber. Alternatively, instead of light pipes, the pyrometers can use lenses to receive radiation emitted by the wafer.

Light pipe 30 is configured to receive thermal energy being emitted by wafer 14 at a particular wave-length. The amount of sensed radiation is then communicated to radiation sensing device 28 which generates a usable voltage signal for determining the temperature of the wafer. In particular, by knowing the amount of thermal radiation being emitted by wafer 14 at a particular wavelength, the temperature of the object can be calculated based, in part, on Planck's Law.

During the process, light pipe 30 should only detect thermal radiation being emitted by wafer 14 and should be prevented from detecting thermal radiation being emitted by lamps 26 at the desired wavelength. In this regard, thermal processing chamber 12 can include spectral filters or windows 32 and 34 which are positioned between lamps 26 and wafer 14. Spectral filters 32 and 34 can be designed if needed to filter out thermal radiation being emitted by lamps 26 which is at the wavelength at which radiation sensing device 28 operates. For instance, in one embodiment, windows 32 and 34 are made from fused silica or quartz. Windows 32 and 34 also serve to prevent the chamber from being contaminated during use.

Radiation sensing devices 28 are placed in communication with a controller 40. Controller 40 which can be, for instance, a microprocessor based device or other programmable device, can also be in communication with the power controller 22 for the lamps 26. Controller 40 can be configured to receive temperature information from radiation sensing devices 28 and, based on such information, automatically control adjustable power controller 22 for maintaining the temperature of the wafer 14 within a desired range. For instance, controller 40 can be programmed to heat the wafer at a particular rate and according to a particular temperature regime that is appropriate for a particular heat treating and/or chemical process.

Figure 3:
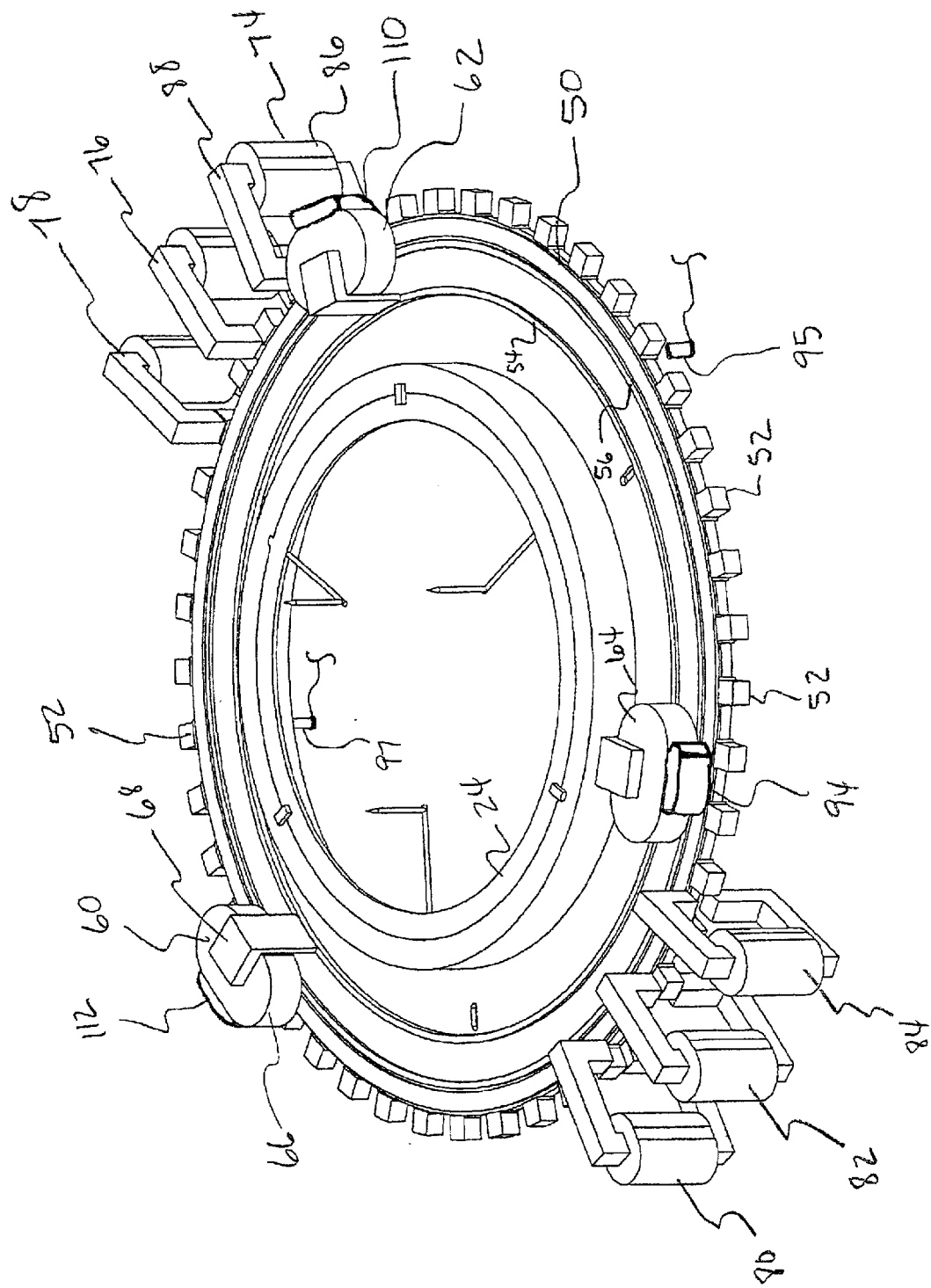
FIG. 3 is a perspective view of one embodiment of a system for rotating wafers in a thermal processing chamber.
Figure 4:
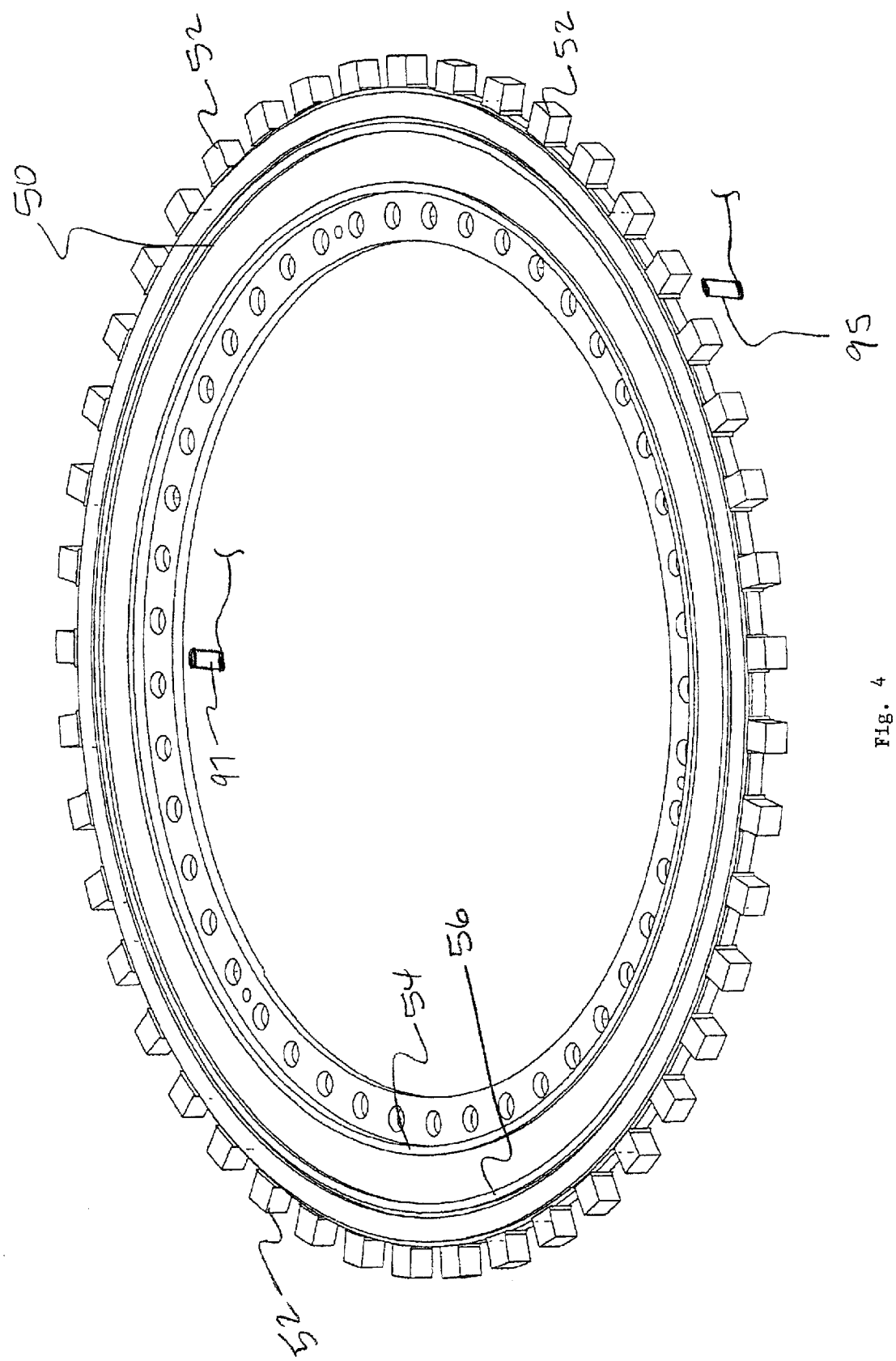
FIG. 4 is a perspective view of one embodiment of a rotor that may be used in the system illustrated in FIG. 3.

One embodiment of a magnetic levitation and rotation system constructed in accordance with the present invention will now be described in detail with reference to FIGS. 1 through 5. As shown, in order to rotate the wafer 14, the wafer is supported on the substrate holder 24. The substrate holder 24, in turn, is supported on a rotatable rotor 50. As shown in FIG. 4, the rotor 50 has a circular ring-like shape. During operation of the apparatus shown in FIG. 1, the rotor 50 is magnetically levitated and rotated which, in turn, rotates the wafer.

The rotor is made partially or completely from a material that is capable of being influenced by a magnetic force. For example, the rotor can be made from a metal, such as magnetic stainless steel. Alternatively, the rotor can be made from a combination of materials. For instance, a quartz rotor can be used embedded with one or more pieces of metal.

Since the rotor is positioned within the thermal processing chamber 12, the rotor should also be capable of withstanding high temperatures without deteriorating or otherwise corroding. Of particular advantage, however, rotors used in the present invention may undergo some thermal expansion. In particular, the system of the present invention allows the rotor to undergo thermal expansion while still maintaining levitation and rotation performance. For example, in the embodiment illustrated in FIG. 1, the rotor can have a radial thermal expansion of up to about 0.08 inches, particularly up to about 0.04 inches at a temperature of 300 degrees C. relative to room temperature (20° C.).

In order to prevent corrosion, the rotor can also be selectively coated with layers of anti-wear and/or anti-corrosive materials depending upon the process conditions. For example, in one embodiment, the rotor can be made from stainless steel and coated with silicon carbide.

As shown in FIG. 4, the rotor 50 includes a plurality of spaced apart teeth 52. The teeth 52 interact with a rotation device for rotating the rotor. It should be understand, however, that a rotor without teeth may also be used in the system of the present invention.

As also illustrated in FIG. 4, the rotor includes a pair of annular raised portion or ridges 54 and 56. Raised portions 54 and 56 assist in levitating the rotor and maintaining the rotor in radial alignment as will be discussed in more detail below.

Figure 2:
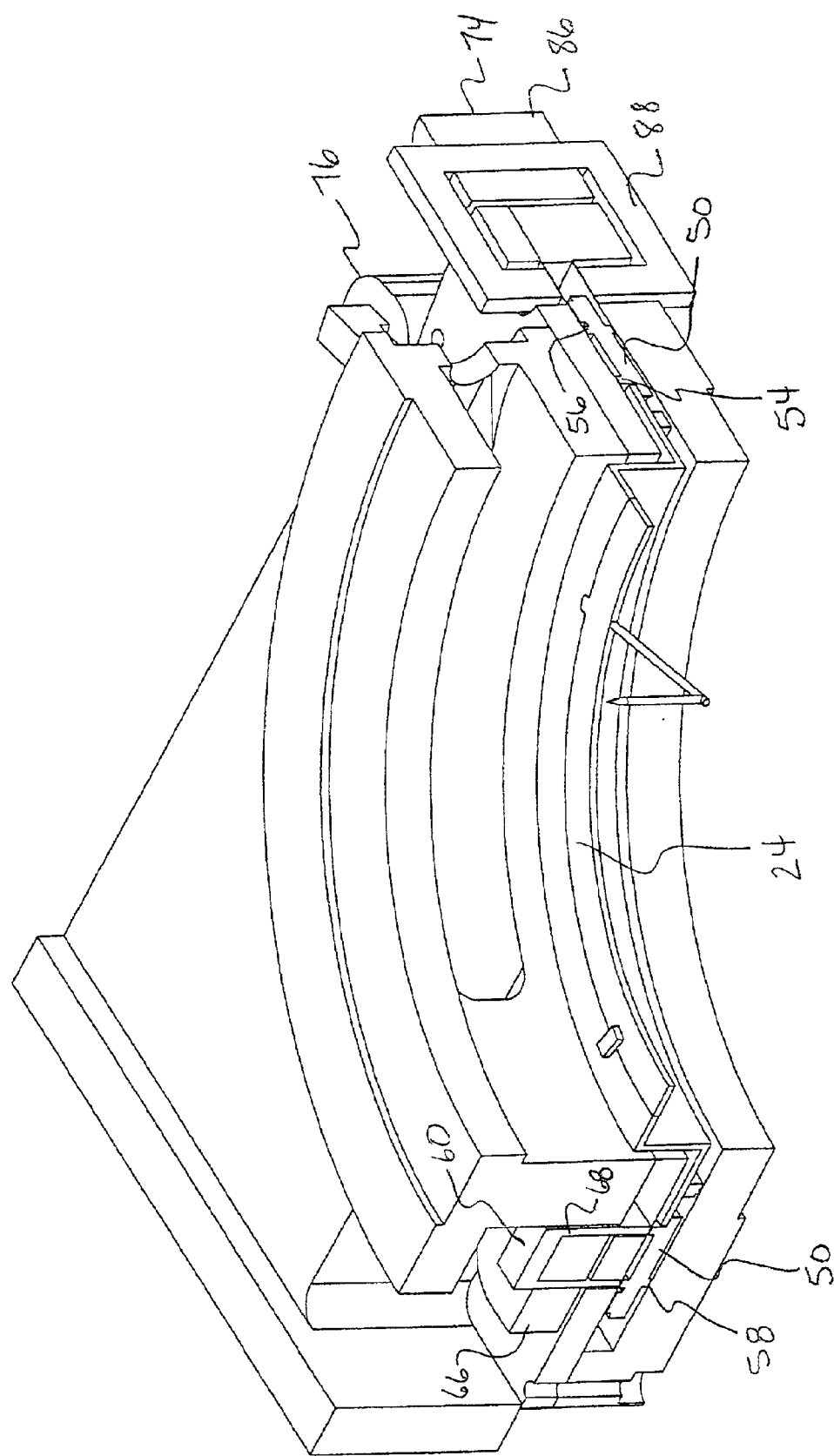
FIG. 2 is a sectional view of a portion of the apparatus illustrated in FIG. 1.
Figure 5:
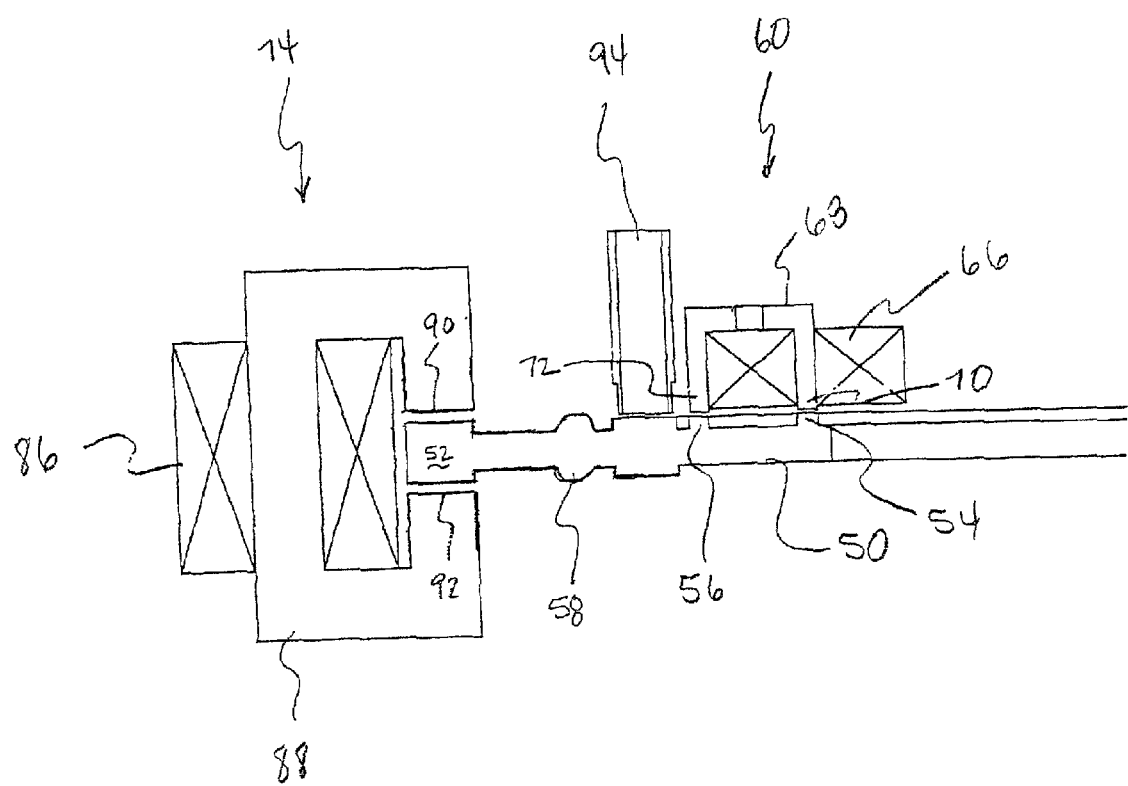
FIG. 5 is a cross-sectional view of a portion of the system illustrated in FIG. 3.

As shown particularly in FIGS. 2 and 5, the rotor can also include an annular rib or foot 58 located on the bottom surface of the rotor. The annular rib 58 can be used as a landing contact area when the rotor is not being levitated or rotated. The annular rib 58 can also be used to dissipate heat from the rotor. As shown in FIG. 5, the annular rib 58 can have a round shape and can be coated with an anti-wear material and/or can be polished to avoid any particles from wearing off the rotor when the rib is resting on a surface. In general, the annular rib can be continuous around the circumference of the rotor or can have intermittent contact areas. As shown in FIG. 5, the annular rib or foot 58 can also be balanced with an annular rib positioned on the top of the rotor. In some embodiments, it may be desirable to place an opposite annular rib on the top of the rotor in order to balance the flux fringing being emitted by the rotation actuator 74, which is described in more detail below.

In order to lift and control the vertical position of the rotor within the chamber, according to the present invention, the system includes at least one suspension actuator 60. In the embodiment illustrated in FIG. 3, the system includes three suspension actuators 60, 62, and 64 which are equally spaced around the circumference of the rotor 50. Depending upon the particular circumstances, more or less suspension actuators may be needed. Further, the suspension actuators need not be equally spaced around the circumference of the rotor. For example, the suspension actuators can have different sizes (arc lengths) to compensate for non-equal spacing.

The suspension actuators 60, 62, and 64 are positioned outside of the thermal processing chamber 12 but are positioned adjacent to and above the rotor 50. If necessary, the wall of the chamber, which can be made from a non-magnetic material such as quartz or non-magnetic stainless steel, can be relatively thin at the location where the suspension actuator is placed above the rotor.

As shown particularly in FIG. 5, each suspension actuator includes a coil 66 wrapped around a U-shaped magnetic element 68. The magnetic element 68 serves as a pole piece and can be either heteropolar or homopolar. The U-shaped magnetic element 68 includes a first end or surface 70 that is placed above the annular raised portion 54 of the rotor 50 and a second end or surface 72 that is placed above and in alignment with the annular raised portion 56.

In order to levitate the rotor 50, an electrical current is fed through the coil 66 which creates a magnetic field within the U-shaped magnetic element 68. The first and second ends 70 and 72 of the magnetic element 68 form a magnetic attraction with the annular raised portions 54 and 56 respectively. By controlling the magnetic field generated by the suspension actuator 60, the rotor 50 can be levitated a particular distance and suspended within the chamber without contacting any adjacent elements. Further, the annular portions 54 and 56 form a close loop of magnetic flux with the suspension actuator 60 and provide radial reluctance centering. Consequently, the annular raised portions 54 and 56 in combination with the first and second ends 70 and 72 of the magnetic element maintain the rotor at a particular radial position.

In order to prevent overheating, each suspension actuator can be installed in a fluid-cooled housing, such as a water-cooled housing. The housing can be easily plugged into the chamber 12 for cooling the suspension actuator. It should be understood, however, that the suspension actuator can be made with a magnetic material capable of withstanding higher temperatures. In this embodiment, no cooling may be necessary.

In order to rotate the rotor 50, the system further includes one or more rotation actuators. For example, as shown in FIG. 3, the system includes six rotation actuators 74, 76, 78, 80, 82, and 84. The rotation actuators are configured to rotate the rotor after the rotor is levitated by the suspension actuators.

Similar to the suspension actuators, the rotation actuators are positioned outside of the chamber 12. Again, the chamber should be made from a non-magnetic material adjacent to the rotation actuators, such as quartz, stainless steel, and the like. The wall of the chamber can be relatively thin at the points where the rotation actuator is positioned adjacent to the rotor, so that the rotation actuator can magnetically rotate the rotor without interference.

Referring to FIG. 5, the rotation actuator 74 includes a coil 86 surrounding a C-shaped magnetic element 88. The C-shaped magnetic element 88 includes a first end or surface 90 opposite a second end or surface 92. The teeth 52 of the rotor 50 are positioned in between the first end 90 and the second end 92 of the magnetic element 88.

In order to rotate the rotor 50, an electric current is fed through the coil 86 which generates a magnetic field in the C-shaped magnetic element 88, which serves as a pole piece. In this embodiment, by pulsing or varying the electric current through the coil 86, a pulsating or variable magnetic field can be created. The variable electric field is used to attract successive teeth 52 on the rotor 50, which in turn causes the rotor to rotate. The speed of rotation can be controlled by controlling the frequency of current fed through the coil 86. In addition, the torque applied to the rotor can be controlled by controlling the amplitude or current fed through the coil. At least two actuators must be present for the rotor to rotate. A single pole can be used to lock the rotor in position.

As described above, the suspension actuators are located above the rotor, while the rotation actuators are positioned around periphery of the rotor. By using this arrangement, of particular advantage, the system allows for some thermal expansion of the rotor during heating. Specifically, thermal expansion of the rotor will not create physical clearance problems in the system.

As shown in FIG. 5, the system can further include at least one position sensor, such as a position sensor 94. The position sensor 94 can be used to monitor the vertical position of the rotor 50. For example, the position sensor 94 can be used to determine the amount the rotor 50 has been raised or lowered when the suspension actuators are operating. Further, the position sensor 94 can also monitor the position of the rotor in relation to a horizontal plane to ensure that the rotor is not wobbling and is instead spinning parallel to the horizontal plane.

Besides using a single position sensor 94 as shown in FIG. 5, in other embodiments, further position sensors can be used. For example, as shown in FIG. 3, the system can include a position sensor for each suspension actuator. As shown, besides position sensor 94, the system includes a position sensor 110 and a position sensor 112.

The types of sensors that can be used in the system of the present invention include Hall Effect sensors and/or laser sensors. In one embodiment, each position sensor can include two different sensors stacked in a vertical arrangement. In this arrangement, the first sensor can act as a reference sensor in order to calculate the distance the second sensor is from the rotor. For example, an air gap inductance measured by the second sensor can be compared to the reference inductance for determining the distance from the rotor.

In addition to sensors that monitor the vertical height of the rotor during levitation, the system can further include sensors that monitor the rotational speed of the rotor. For instance, as shown in FIGS. 3 and 4, the system can include a rotational speed sensor 95 and a homing sensor 97 located below the rotor at different radii. Rotational speed sensor 95 can be used to monitor the rotational speed and acceleration of the rotor by monitoring each tooth that passes. The system can include more than one speed sensor for improving accuracy. Homing sensor 97, on the other hand, can indicate the position of the rotor for monitoring the homing position. Specifically, homing sensor 97 can be placed at the same radial position as an indicator mark on the rotor. The indicator mark can be, for instance, a notch, a tab, a dimple, a counterbore, and the like. The homing sensor can be used to sense the location of the indicator mark on the rotor in order to place wafers in the chamber in a certain position and to take out the wafers in a certain position. Again, these sensors can be Hall Effect sensors, laser sensors or photo sensors.

During operation of the thermal processing system illustrated in FIG. 1, the rotor is first lifted up from a landing position by activating the suspension actuators. The rotor can be controlled at an idle position where the rotor is levitated without contacting the chamber walls and other surfaces. The distance between the landing and levitated positions of the rotor may be, for instance, in a range of from about 0.015 inches to about 0.1 inches.

Once levitated, the rotation actuators can be used to rotate the rotor. The speed sensor 95 can also be included within the chamber to monitor the acceleration and speed of the rotor as it rotates.

Once a semiconductor wafer supported by the rotor is processed according to a desired result, rotation of the rotor is ceased. Next, the rotor can be lowered from its idle position to the landing position. The suspension actuators can be used to slowly drop the rotor to prevent surface damage on the rotor or on the surface upon which the rotor rests.

In one embodiment, control of the rotation of the wafer can be completely automated. For example, as shown in FIG. 1, the controller 40 is connected to the power controller 22. The power controller 22 can be, in turn, in communication with the suspension actuators via line 96 and with the rotation actuators via line 98 for controlling the electric current that is fed to the actuators, which, controls the strength of the magnetic field. As described above, the power controller 22 can also be connected to the lamps 26 via line 100. It should be understood, that more than one power controller can be used.

As also shown in FIG. 1, the controller 40 is further configured to receive input from the temperature sensing devices 28 and from the position sensor 94, the speed sensor 95 and the homing sensor 97 via input line 102.

In this manner, the controller 40 can be used to rotate the wafer 14 and simultaneously heat the wafer using lamps 26. During processing, the controller can receive information from the position sensor, the speed sensor and the homing sensor. The sensors can provide continuous feedback to the control system to adjust the position of the wafer so it maintains alignment with a horizontal plane and is rotating at an appropriate speed. The algorithm within the controller can continually update the magnetic field in each suspension actuator and rotation actuator so that the wafer spins substantially parallel to the horizontal plane and at the desired rate. Further, the controller can receive temperature information from the temperature sensing devices 28 and then, in turn, control the amount of light energy being emitted by the lamps 26. It should be understood, however, that in an alternative embodiment controller 40 can be used solely to automate the wafer rotation system.

Likewise, the controller can receive information from the position sensor 94 and levitate and rotate the wafer accordingly. During rotation, the position sensor can also indicate to the controller 40 whether or not the wafer is rotating in alignment with a horizontal plane. Should it be determined that the wafer is not in alignment, the controller 40 can be configured to control the magnetic field in each suspension actuator 60, 62, and 64 for making the wafer spin substantially parallel to the plane.

Consequently, during a heating process in the chamber, the controller 40 can be configured to levitate and control the vertical height of the rotor, can rotate and adjust the rotational speed of the rotor, and can also home the rotor.

Figure 6:
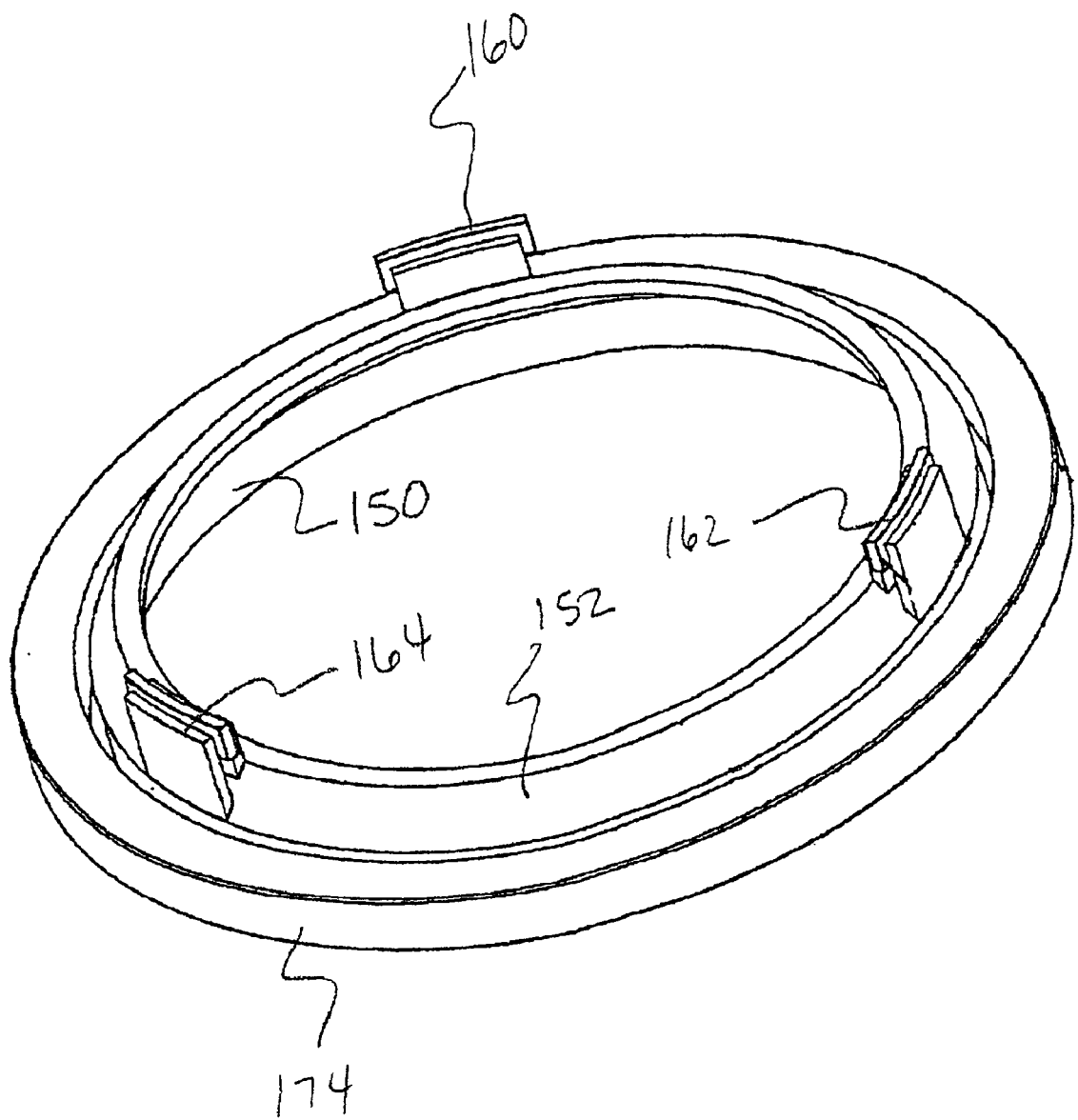
FIG. 6 is a perspective view of an alternative embodiment of a system for levitating and rotating wafers made in accordance with the present invention.

Referring now to FIG. 6, an alternative embodiment of a wafer levitation and rotation system is illustrated. In this embodiment, a rotor 150 is surrounded by a rotation device 174. Rotation device 174 is represented by a ring element that is capable of creating a magnetic field which causes the rotor 150 to rotate.

In order to levitate the rotor 150, the system includes three suspension actuators 160, 162, and 164.

In this embodiment, the suspension actuators 160, 162, and 164 not only control the axial position of the rotor 150 but also control the radial position of the rotor. For example, as shown, the rotor includes a conically shaped surface 152. The suspension actuators 160, 162, and 164 are positioned adjacent to the conically shaped surface 152 at a complementary angle. Consequently, in this arrangement, the suspension actuators not only apply a force to the rotor in the axial direction but also in the radial direction. By controlling the strength of the magnetic field in each of the suspension actuators, the rotor 150 can be levitated and maintained at a particular radial position.

Rotor 150 as shown in FIG. 6 can include a plurality of radial teeth similar to the embodiment illustrated in FIGS. 3 and 4. The radial teeth can be used to facilitate rotation of the rotor and can be used to monitor the position of the rotor.

Figure 7:
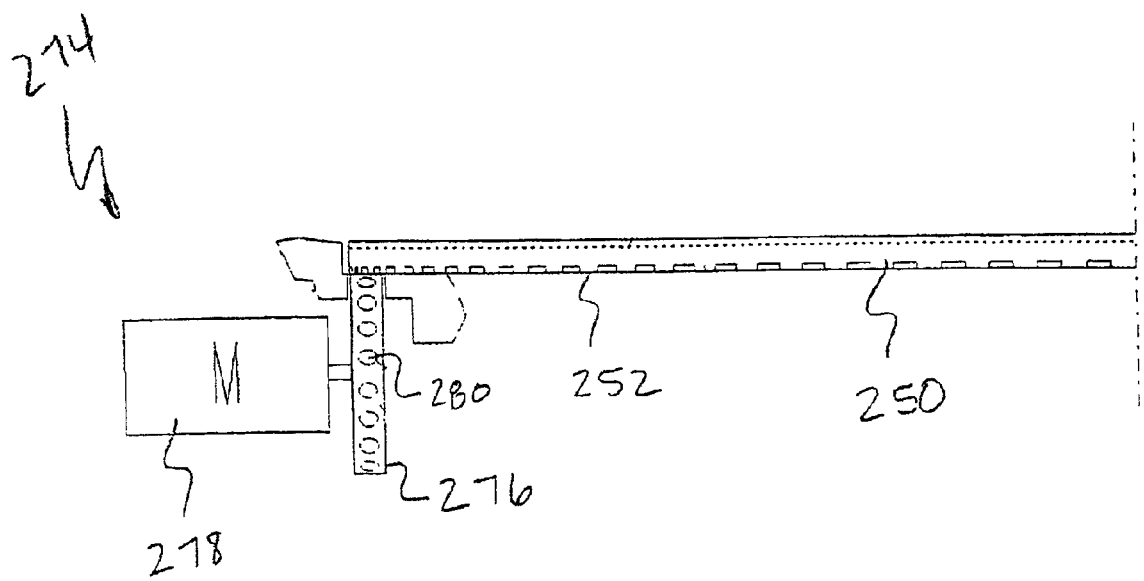
FIG. 7 is a side view of an alternative embodiment of a rotational device for use in wafer rotation systems of the present invention.

Referring to FIG. 7, a further alternative embodiment of a magnetic rotation system is illustrated. In this embodiment, the system includes a rotation device 274 placed adjacent to a rotor 250. Suspension actuators as described above may also be used in the system which are not shown.

As shown, the rotor 250 includes a plurality of teeth 252 located on the bottom surface of the rotor. The rotation device 274 includes a magnetic disk 276 coupled to a motor 278. On the periphery of the disk 276 are located a number of alternating North-South permanent magnets 280 arranged with the magnetic pole ends in the radial direction. The disk 276 is located outside of the process chamber and oriented either vertically (as shown) or horizontally around the outer diameter of the rotor.

In this arrangement, the motor 278 is used to rotate the disk 276, which in turn, rotates the rotor 250 by interacting with the teeth 252. In particular, the rotating permanent magnets induce a field in the rotor. The induced field causes an attractive force to be set up between the rotor and each rotating permanent magnet. As the magnet turns and moves away from the induced field on the rotor, the attractive force results in a torque which causes the rotor to rotate. It is believed that teeth 252 are not necessary in order to rotate the rotor. Further, it should be understood that more than one rotation device 274 can be placed around the periphery of the rotor 250 as desired.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only and is not intended to limit the invention so further described in such appended claims.

What is claimed is:

1. A system for processing semiconductor wafers comprising:
   a thermal processing chamber adapted to contain semiconductor wafers;
   a heating device for heating semiconductor wafers contained within said chamber;
   a rotor positioned within said thermal processing chamber having a top and bottom, said rotor being configured to support a semiconductor wafer, said rotor having a circular shape and being comprised of a material capable of being influenced by a magnetic force; and
   at least one rotation actuator having a first rotation surface spaced from a second opposing rotation surface, the first rotation surface being positioned above the rotor and facing the top of the rotor, the second rotation surface being positioned below the rotor and facing the bottom of the rotor, said rotor being positioned in between said first and second rotation surfaces, said rotation actuator being configured to generate a magnetic field that causes said rotor to rotate without contacting said rotor.

2. A system as defined in claim 1, wherein said rotation actuator is positioned outside of said thermal processing chamber.

3. A system as defined in claim 1, wherein said rotation actuator comprises a C-shaped magnetic element having a pair of opposing poles that define said first and second rotation surfaces, said C-shaped magnetic element being placed in operative association with an electric coil that generates said magnetic field when an electric current is fed through said coil.

4. A system as defined in claim 1, wherein said rotor includes spaced apart radial teeth, said teeth being positioned in between said first and second opposing rotation surfaces.

5. A system as defined in claim 4, wherein said rotation actuator is configured to generate a variable magnetic field which acts upon said radial teeth to rotate said rotor.

6. A system as defined in claim 1, wherein said system includes at least three rotation actuators.

7. A system as defined in claim 1, wherein said system includes at least six rotation actuators.

8. A system as defined in claim 1, further comprising at least one suspension actuator positioned above said rotor, said suspension actuator being configured to generate a magnetic field and levitate said rotor during rotation.

9. A system as defined in claim 8, wherein said system includes at least three suspension actuators spaced around said rotor.

10. A system as defined in claim 8, wherein said suspension actuator includes a first suspension surface and a second suspension surface that face said rotor, said surfaces being capable of being magnetized for levitating said rotor.

11. A system as defined in claim 10, wherein said rotor includes first and second annular raised portions, said first and second annular raised portions being positioned below said first and second suspension surfaces respectively.

12. A system as defined in claim 8, further comprising a position senor and speed sensor located adjacent to said rotor, said position senor for monitoring the vertical position of said rotor, said speed sensor for monitoring the speed of said rotor.

13. A system as defined in claim 1, wherein said heating device comprises a plurality of light energy sources positioned outside said chamber.

14. A system as defined in claim 1, further comprising:
   a temperature sensing device for sensing the temperature of a semiconductor wafer contained in said thermal processing chamber; and
   a controller in communication with said temperature sensing device, said controller receiving temperature information from said temperature sensing device and, based on said information, adjusting said heating device for controlling the temperature of said semiconductor wafer within preset limits.

15. A system for processing semiconductor wafers comprising:
   a thermal processing chamber adapted to contain semiconductor wafers;
   a heating device for heating semiconductor wafers contained within said chamber;
   a rotor positioned within said thermal processing chamber, said rotor being configured to support a semiconductor wafer, said rotor having a circular shape and being comprised of a material capable of being influenced by a magnetic force;
   at least one suspension actuator positioned above said rotor, said suspension actuator including a first suspension surface and a second suspension surface that each face said rotor, said rotor including first and second annular raised portions, said first and second raised portions being positioned below said first and second suspension surfaces respectively, said suspension actuator being configured to generate a magnetic field through said first and second suspension surfaces for levitating said rotor without contacting said rotor; and
   a rotation device that generates a magnetic field for rotating said rotor when levitated.

16. A system as defined in claim 15, wherein said system includes at least three suspension actuators spaced around said rotor.

17. A system as defined in claim 15, wherein said heating device comprises a plurality of light energy sources.

18. A system as defined in claim 15, further comprising a position sensor and a speed sensor located adjacent to said rotor, said position senor for monitoring the vertical position of said rotor, said speed sensor for monitoring the speed of said rotor.

19. A system as defined in claim 15, wherein said suspension actuator comprises a U-shaped magnetic element having a pair of opposing ends that define the first and second suspension surfaces, said U-shaped magnetic element being placed in operative association with an electric coil that generates a magnetic field when an electric current is fed through said coil.

20. A system as defined in claim 15, wherein said system includes at least two suspension actuators spaced around said rotor, and wherein said system further comprises:
   a position sensor for monitoring the vertical position of said rotor in relation to a horizontal plane; and a controller in communication with said position sensor and with said suspension actuators, said controller being configured to receive information from said position sensor regarding the position of said rotor and, based on said information, to independently adjust each of said suspension actuators for levitating said rotor a determined distance and for maintaining said rotor parallel to said horizontal plane.

21. A system as defined in claim 20, wherein said controller is further configured to control said rotation device for controlling the rotation of said rotor.

22. A system as defined in claim 15, wherein said rotation device includes at least one rotation actuator having a first rotation surface spaced from a second opposing rotation surface, said rotor being positioned in between said first and second rotation surfaces, said rotation actuator being configured to generate a magnetic field that causes such rotor to rotate without contacting said rotor.

23. A system for processing semiconductor wafers comprising:
   a thermal processing chamber adapted to contain semiconductor wafers;
   a heating device for heating semiconductor wafers contained within said chamber;
   a rotor positioned within said thermal processing chamber, said rotor being configured to support a semiconductor wafer, said rotor having a circular shape and being comprised of a material capable of being influenced by a magnetic force, said rotor including spaced apart radial teeth; and
   at least one rotation actuator positioned adjacent to said rotor, the rotation actuator including a first rotation surface spaced from a second opposing rotation surface, the spaced apart radial teeth of the rotor being rotatably positioned in between the first and second rotation surfaces, said rotation actuator being configured to generate a pulsating magnetic field which acts upon said radial teeth to rotate said rotor.

24. A system as defined in claim 23, wherein said rotation actuator includes a magnetic element having a pair of opposing ends that define the first rotation surface and the second opposing rotation surface, said magnetic element being in operative association with a magnetic coil that generates said magnetic field when an electric current is fed through said coil.

25. A system as defined in claim 23, wherein said system includes at least three rotation actuators.

26. A system as defined in claim 23, further comprising at least one suspension actuator positioned above said rotor, said suspension actuator being configured to generate a magnetic field and levitate said rotor during rotation.

27. A system as defined in claim 26, wherein said system includes at least three suspension actuators spaced around said rotor.

28. A system as defined in claim 26, wherein said suspension actuator includes a first suspension surface and a second suspension surface that face said rotor, said surfaces capable of being magnetized for levitating said rotor.

29. A system as defined in claim 28, wherein said rotor includes first and second annular raised portions, said first and second suspension surfaces respectively.

30. A system as defined in claim 26, wherein said system includes at least two suspension actuators spaced around said rotor, and wherein said system further comprises:
   a position sensor for monitoring the vertical position of said rotor in relation to a horizontal plane; and a controller in communication with said position senor and with said suspension actuators, said controller being configured to receive information from said position sensor regarding the position of said rotor and, based on said information, to independently adjust each of said suspension actuators for levitating said rotor a determined distance and for maintaining said rotor parallel to said horizontal plane.

31. A system as defined in claim 26, wherein said rotation actuator is positioned outside of said thermal processing chamber.

32. A system for processing semiconductor wafers comprising:
   a thermal processing chamber adapted to contain semiconductor wafers;
   a heating device for heating semiconductor wafers contained in said chamber;
   a rotor positioned within said thermal processing chamber, said rotor being configured to support a semiconductor wafer supporting said substrate holder, said rotor having a circular shape and being comprised of a material capable of being influenced by a magnetic force;
   at least one rotation actuator positioned adjacent to said rotor outside of said thermal processing chamber, said rotation actuator comprising a rotation element placed in operative association with a magnetic coil that generates a magnetic field when an electric current is fed through said coil, said rotor including spaced apart radial teeth and wherein said rotation actuator is configured to generate a pulsating magnetic field which acts upon said radial teeth to rotate said rotor;
   at least one suspension actuator positioned above said rotor outside of said thermal processing chamber, said suspension actuator being configured to generate a magnetic field and levitate said rotor during rotation; and
   a controller in communication with said rotation actuator and said suspension actuator, said controller being configured to control said rotation actuator and said suspension actuator for levitating and rotating said rotor at selected times.

33. A system as defined in claim 32, wherein said rotation actuator defines a first rotation surface and a second rotation surface, said radial teeth of said rotor being spaced in between said first and second rotation surfaces.

34. A system as defined in claim 32, wherein said system includes at least three suspension actuators positioned above said rotor.

35. A system as defined in claim 32, wherein said rotor has a conically-shaped surface and wherein said suspension actuator is positioned adjacent to said surface for levitating said rotor and for maintaining said rotor at a particular radial and also axial position.

36. A system as defined in claim 32, wherein said suspension actuator includes a first suspension surface and a second suspension surface that face said rotor, said surfaces capable of being magnetized for levitating said rotor.

37. A system as defined in claim 36, wherein said rotor includes first and second annular raised portions, said first and second annular raised portions being positioned below said first and second suspension surfaces respectively.

38. A system as defined in claim 32, wherein said system includes at least two suspension actuators spaced around said rotor and wherein said system further comprises a position sensor for monitoring the vertical position of said rotor in relation to a horizontal plane, said position sensor being in communication with said controller and wherein said controller is configured to receive information from said position sensor and, based on said information, to independently control said suspension actuators for levitating said rotor a selected distance and for maintaining said rotor parallel to said horizontal plane.

* * * * *